(12) United States Patent
Sedberry, Jr. et al.

(10) Patent No.: US 8,740,654 B2
(45) Date of Patent: Jun. 3, 2014

(54) FLEXIBLE ORGANIZATIONAL CONNECT

(76) Inventors: Philip Anthony Sedberry, Jr., High Point, NC (US); David Mark Wilson, Kernersville, NC (US); Donald Wayne Helton, Ridgeway, VA (US); Christopher John Boggs, Trinity, NC (US); James Alan Hall, High Point, NC (US); Glen Christopherson, High Point, NC (US)

( * ) Notice: Subject to any disclaimer, the term of this patent is extended or adjusted under 35 U.S.C. 154(b) by 29 days.

(21) Appl. No.: 13/586,249

(22) Filed: Aug. 15, 2012

(65) Prior Publication Data

US 2013/0045625 A1    Feb. 21, 2013

Related U.S. Application Data

(60) Provisional application No. 61/523,667, filed on Aug. 15, 2011.

(51) Int. Cl.
  *H01R 9/26* (2006.01)

(52) U.S. Cl.
  USPC .......................................... 439/716; 439/717

(58) Field of Classification Search
  USPC .................... 439/715–719, 157, 372
  See application file for complete search history.

(56) References Cited

U.S. PATENT DOCUMENTS

| | | | | |
|---|---|---|---|---|
| 4,219,935 A * | 9/1980 | Braginetz et al. | | 33/533 |
| 4,329,005 A * | 5/1982 | Braginetz et al. | | 439/51 |
| 4,875,861 A * | 10/1989 | Pennington | | 439/79 |
| 4,915,641 A * | 4/1990 | Miskin et al. | | 439/247 |
| 4,984,383 A * | 1/1991 | Mummey et al. | | 439/259 |
| 5,007,858 A * | 4/1991 | Daly et al. | | 439/498 |
| 5,356,315 A * | 10/1994 | Jankowski et al. | | 439/701 |
| 5,545,053 A * | 8/1996 | Ishii et al. | | 439/364 |
| 5,562,458 A * | 10/1996 | Stora et al. | | 439/348 |
| 6,547,587 B2 * | 4/2003 | Hurst et al. | | 439/532 |
| 6,608,764 B2 * | 8/2003 | Clark et al. | | 361/796 |
| 6,988,914 B2 * | 1/2006 | Pepe et al. | | 439/638 |
| 6,997,741 B2 * | 2/2006 | Doll et al. | | 439/540.1 |
| 7,037,124 B2 * | 5/2006 | Lee et al. | | 439/157 |
| 7,091,415 B2 | 8/2006 | Ashby et al. | | 174/52.1 |
| 7,322,842 B2 * | 1/2008 | Duck et al. | | 439/289 |
| 7,367,850 B1 * | 5/2008 | Chang | | 439/676 |
| 7,485,012 B2 * | 2/2009 | Daugherty et al. | | 439/701 |
| 7,533,460 B2 * | 5/2009 | Doll et al. | | 29/854 |
| 7,878,824 B2 * | 2/2011 | Pepe et al. | | 439/95 |
| 7,914,324 B2 * | 3/2011 | Pepe et al. | | 439/540.1 |
| 7,936,172 B2 * | 5/2011 | Nordstrom et al. | | 324/555 |
| 8,351,218 B2 * | 1/2013 | Stowers et al. | | 361/810 |
| 8,425,247 B2 * | 4/2013 | Wojcik et al. | | 439/352 |
| 2003/0194914 A1 * | 10/2003 | Duck et al. | | 439/701 |
| 2009/0223712 A1 * | 9/2009 | Stowers et al. | | 174/535 |

\* cited by examiner

*Primary Examiner* — Ross Gushi
(74) *Attorney, Agent, or Firm* — MacCord Mason PLLC

(57) ABSTRACT

A flexible organizational connect is shown and described. In one embodiment, the device comprises a flexible receiver assembly for receiving an interchangeable test adapter for a mass interconnect device. Typically, the flexible receiver assembly includes an integral structural unit and an interchangeable connection assembly. In other embodiments, a mass interconnect device includes an interchangeable test adapter and a flexible receiver assembly.

16 Claims, 10 Drawing Sheets

FLEXIBLE ORGANIZATIONAL CONNECT

RELATED APPLICATIONS

This application claims priority to U.S. provisional application 61/523,667, filed Aug. 15, 2011, which is incorporated herein by reference in its entirety.

FIELD

The present disclosure relates generally to electrical connectors and, more particularly, to an improved receiver and interchangeable testing components for enhancing the organizational and interchangeable electrical engagement between a test adapter and automated testing equipment.

BACKGROUND

Mass interconnect systems and devices enhance connectivity and allow for the reduction, or even elimination, of conventional wiring harnesses when testing complex electrical and electromechanical systems. Typically, mass interconnect systems bring many electrical contacts into contact with each other simultaneously to facilitate efficient connection and disconnection of the testing equipment. For instance, mass interconnect systems and devices may eliminate capacitances, signal crosstalk or other attenuational concerns presented by traditional cable-based systems and devices. Further, mass interconnect systems provide higher degrees of stability, which provide for improved system performance and up-time.

Mass interconnect systems often require the placement of interchange test adapters, or similar wiring modules with multiple electrical contacts in operative engagement with opposing co-acting contact of receiver modules. Typically, the receiver contacts and the interchangeable test adapter align with precision, for instance to minimize, or eliminate, wear and/or equipment damage.

Often the mass interconnect systems connect a testing unit to automated testing equipment. For instance, a mass interconnect system may provide electrical connection for a PCI eXtensions for Instrumentations (PXI)-based test system. PXI systems are intended to measure and automate high-performance applications. Typically, PXI systems incorporate standards governed by the PXI Systems Alliance, all of which are hereby incorporated by reference. For instance, PXI may integrate timing and synchronization to rout synchronization clocks and be reprogrammed to match test, measurement and automation demands.

Traditional cable-based automatic test equipment systems and devices often require system calibrations, which take significant time to remove and carry the risk of performance problems once reinstalled. Mass interconnect systems also help lower the cost of integrating and wiring the systems.

Therefore, Applicants desire a system and method for flexible organization in a mass interconnect system without the drawbacks presented by the traditional systems and methods.

SUMMARY

In accordance with the present disclosure, a flexible receiver assembly is provided for receiving an interchangeable test adapter for a mass interconnect device. This disclosure provides an improved mass interconnect device and receiver assembly that is convenient, efficient and safe for the user, particularly when used in operating PXI-based test system.

In one embodiment, in a mass interconnect system having a test adapter and a testing unit, a flexible receiver assembly comprising an integral structural unit and at least one rear-loading adjacent building block assembly. In particular examples, the integral structural unit may mirror connections and slidingly mount with the interchangeable test adapter. The flexible receiver assembly may include a frame having an upper tier opening adapted to secure interchangeable connection modules. The flexible receiver assembly may also include a frame having a lower tier opening adapted to secure interchangeable connection modules.

In some examples, the lower tier includes a rail assembly to secure interchangeable connection modules. The interchangeable connector modules may be assembled in adjacent carrier building blocks.

In yet other examples, the receiver may include a modular linkage assembly to engage the test adapter. The modular linkage assembly may have a torsional shaft between a pair of opposing vertical sides of the receiver. Further, the modular linkage assembly may have needle bearings at friction points.

In yet other embodiments, a mass interconnect system may comprise a test adapter and a flexible receiver assembly. The flexible receiver assembly may have interchangeable connection modules affixed from a rear face of the receiver assembly. Further, the flexible receiver assembly and interchangeable connection modules may form an integral structural unit to mirror and mate with the test adapter.

In particular examples, the test adapter may include at least one adapter module to mirror connection with the receiver interchangeable connection module. The adapter module may include a mating face adapted to interface with the receiver interchangeable connection module in an assembled position. The adapter module may include a printed circuit board. The printed circuit board may include a cable attachment for communication devices chosen from HDMI, Ethernet, DMI, USB, seta signal transmission technology and a combination thereof. The adapter module may include location tabs for orienting the adapter module into placement about the test adapter. The adapter module may include a low insertion force connection assembly.

In yet other examples, the interchangeable test adapter may include a test adapter frame having a first, second, third and fourth sides, the first and second sides opposing one another and the third and fourth sides opposing one another and the first and second sides being substantially perpendicular to the third and fourth sides. Further, the test adapter frame may separate the test adapter into an upper tier and a lower tier. The test adapter frame may include roller pins being positioned to align with the receiver assembly in a mated position. In particular embodiments, the test adapter is a legacy adapter.

In other embodiments, the disclosure provides a method of assembling a bench-top mass interconnect system having a test adapter and a flexible receiver. The method may comprise providing a test adapter with adapter modules and securing interchangeable connection modules on the receiver through a rear face of the receiver. The securing may be in alignment with the adapter modules. Additionally, the method may include mating the test adapter and the receiver in electrical communication for mass interconnect testing.

Yet another embodiment of the present disclosure is to provide a flexible receiver assembly device that comprises an integral structural unit and an adjacent carrier building block assembly. The flexible receiver assembly may be for receiving an interchangeable test adapter for a mass interconnect device. The integral structural unit may mirror connections and slidingly mount with the interchangeable test adapter.

The flexible receiver assembly may include a generally rectangular frame having an upper tier opening. In some examples, the flexible receiver assembly may have a generally rectangular frame having a lower tier opening. The lower tier opening may be adapted to enclose adjacent carrier building blocks. The adjacent carrier building blocks may include a mating side. The adjacent carrier building blocks may include a chassis side.

Further, the adjacent carrier building blocks may include adapter openings The adapter openings may receive connector modules. The connector modules may be adapted to accommodate one test fixture per module. In other examples, the connector modules may be adapted to accommodate at least two test fixtures per module. In yet other examples, the adapter openings may be adapted to receive a test fixture.

In other embodiments, a mass interconnect device may include an interchangeable test adapter and a flexible receiver assembly. The flexible receiver assembly may form an integral structural unit to receive and mirror connections of the interchangeable test adapter. The mass interconnect device may include a plurality of adjacent connector modules. The connector modules may include a mating face for instance that is adapted to interface with the interchangeable test adapter. Further, the adjacent connector modules may include a wiring face for instance that is adapted to connect with a test fixture. The interchangeable test adapter may include a test adapter frame having a first, second, third and fourth sides, the first and second sides may be opposing one another and the third and fourth sides may be opposing one another and the first and second sides may be substantially perpendicular to the third and fourth sides.

In other examples, the test adapter frame may include an intermediary support member. The test adapter frame may define a bottom opening. Further, the test adapter frame may have a filler plate to conceal at least a portion of the bottom opening. The test adapter frame may define a top opening. The test adapter frame may have roller pins that are positioned to align with the receiver assembly, for instance in a second, mated position.

In other examples, the interchangeable test adapter is a legacy adapter. The interchangeable test adapter may also include connection pins to mirror connection pins on the receiver.

Another embodiment of the disclosure includes an interchangeable test adapter, a flexible receiver assembly and a plurality of adjacent connector modules. The flexible receiver assembly may form a flexible structural unit to mirror connections of the interchangeable test adapter and may include adjacent carrier building blocks.

The adjacent connector modules may include a wiring face that is adapted to connect with a test fixture. The interchangeable test adapter may include a test adapter frame having a first, second, third and fourth sides. The first and second sides may be opposing one another and the third and fourth sides opposing one another. The first and second sides may also be substantially perpendicular to the third and fourth sides. The test adapter frame may further include an intermediary support member. The test adapter frame may define a bottom opening. The test adapter frame may include a filler plate concealing at least a portion of the bottom opening. Further, the test adapter frame may define a top opening.

The test adapter frame may include roller pins being positioned to align with the receiver assembly, for instance in a second, mated position. The interchangeable test adapter may be a legacy adapter. The interchangeable test adapter may include connection pins to mirror connection pins on the receiver.

The flexible receiver assembly may include a generally rectangular frame having an upper tier opening. Further, the flexible receiver assembly may include a generally rectangular frame having a lower tier opening The lower tier opening may be adapted to enclose adjacent carrier building blocks. The adjacent carrier building blocks may include a chassis side. Additionally, the adjacent carrier building blocks may include a plurality of individual adapter openings. These adapter openings may be adapted to receive connector modules. The connector modules may be adapted to accommodate one test fixture per module. In other embodiments, the connector modules may be adapted to accommodate at least two test fixtures per module.

The above summary was intended to summarize certain embodiments of the present disclosure. Embodiments will be set forth in more detail in the figures and description of embodiments below. It will be apparent, however, that the description of embodiments is not intended to limit the present inventions, the scope of which should be properly determined by the appended claims.

BRIEF DESCRIPTION OF THE DRAWINGS

Embodiments of the disclosure will be better understood by a reading of the Description of Embodiments along with a review of the drawings, in which.

DESCRIPTION OF EMBODIMENTS

Figure 1:
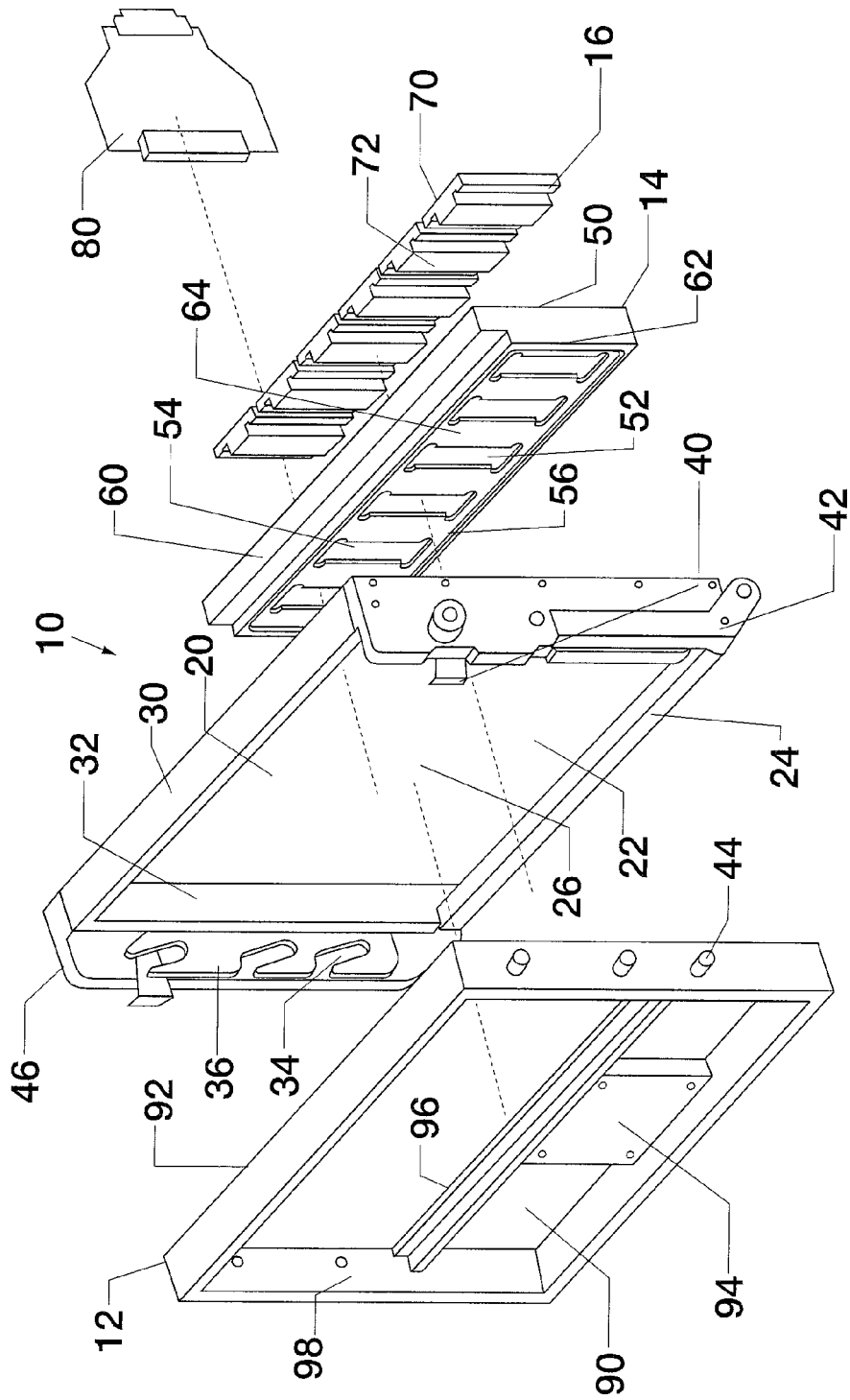
FIG. 1 is an exploded perspective view of a mass interconnect assembly, including a receiver, a test adapter and test fixture interconnect according to one embodiment of the disclosure.

In the following description, like reference characters designate like or corresponding parts throughout the several views. Also in the following description, it is to be understood that such terms as "forward," "rearward," "left," "right" "upwardly," "downwardly," and the like are words of convenience and are not to be construed as limiting terms.

Figure 3:
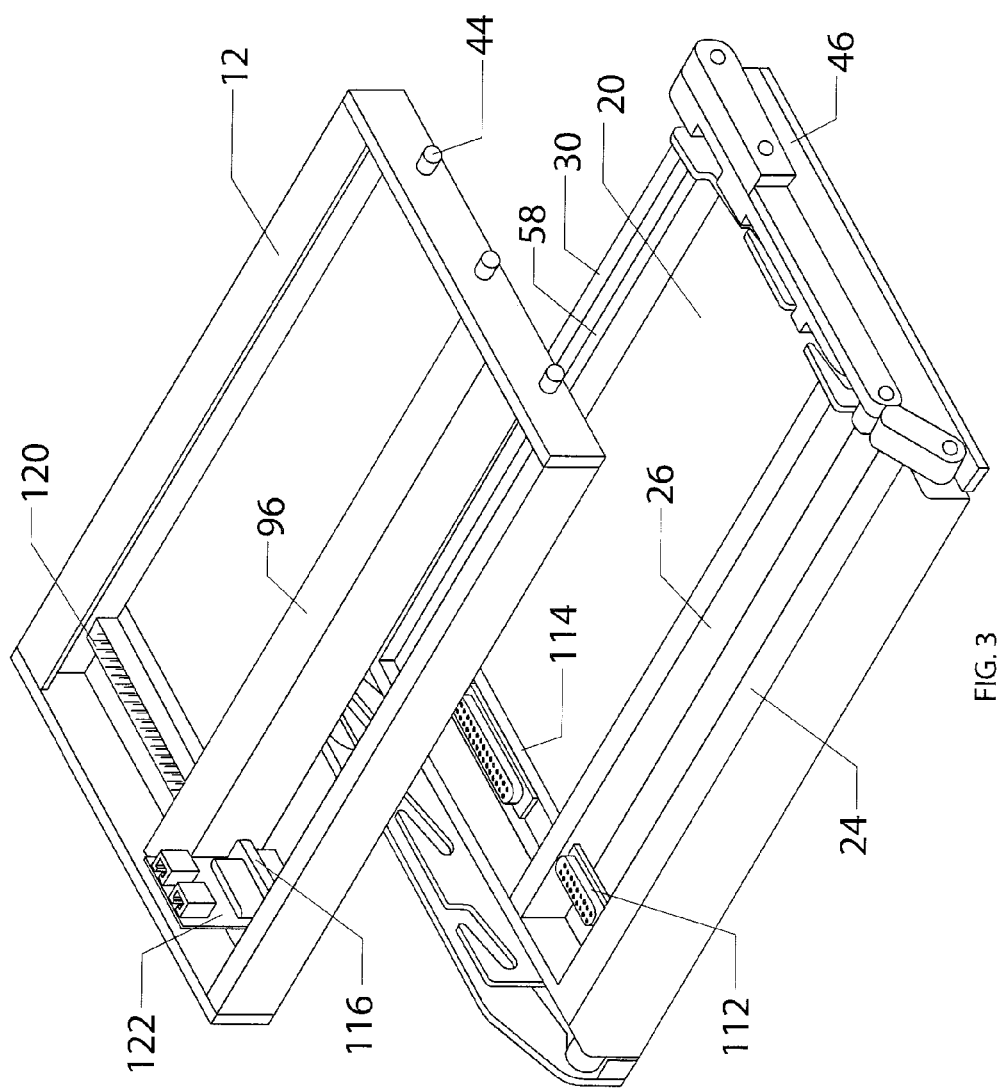
FIG. 3 is a partially exploded view of another mass interconnect assembly embodiment, including a receiver, a test adapter and a plurality of interchangeable connectors.

Referring now to the drawings in general and FIGS. 1 and 3 in particular, it will be understood that the illustrations are for the purpose of describing embodiments of the disclosure and are not intended to limit the disclosure or any inventions thereto. As best seen in FIGS. 1 and 3, a mass interconnect assembly, and flexible receiver assembly 10 and interchangeable test adapter 12 in particular, is shown embodied according to embodiments of the present disclosure. Flexible receiver assembly 10 may include a receiver 46, a carrier building block assembly 14 and interchangeable connector modules 16, 112 and 114. Typically, the interchangeable connector modules are integrated into the flexible receiver assembly 10 from the rear face of the receiver to reduce, or even eliminate, integration concerns associated with feeding the modules through the front face of the system. Typically, flexible receiver assembly 10 mechanically engages with interchangeable test adapter 12 (ITA) for testing of a piece of automated test equipment.

As shown in FIGS. 1 and 3, receiver 46 is configured to provide the sprocket side of the interface with interchangeable test adapter 12 of the general type shown and described in U.S. Pat. Nos. 4,329,005 and 7,016,199, the contents of which are both incorporated herein by reference. However, it is within the sprit of this disclosure for receiver 46 to be configured in a variety of interchangeable arrangements for mounting to a variety of particular pieces of test equipment. FIG. 1 shows flexible receiver assembly 10 properly aligning the connections of receiver 46 to the connections in the interchangeable test adapter 12 to complete the electrical connection between the mating pin/socket contacts. Generally, interchangeable test adapter 12 is the plug to receiver's 46 sprocket and contains mirroring connection with receiver 46.

Typically, receiver 46 has at least two pairs of opposing outer sides that form a generally rectangular, or square, receiver frame. As depicted in FIGS. 1 and 3, receiver 46 is adapted to be mounted and mated with interchangeable test adapter 12 in a substantially vertical manner, however other embodiments include a modular receiver 46 and such receiver 46 may be positioned in a variety of orientations with respect to the interchangeable test adapter 12. For example, other embodiments may include non-rectangular geometrical receivers, for instance to mate with a variety of interchangeable test adapters, including non-rectangular interchangeable test adapters.

In particular embodiments, receiver assembly 10 includes multiple tiers in receiver 46 to house connection modules between interchangeable test adapter 12 and a piece of automated test equipment, for instance a PXI instrument. The multiple tiers may be openings that are framed by horizontal and vertical support members. Typically, the receiver assembly's 10 horizontal and vertical support members include outer wall members which define the outer periphery of the receiver to mate with ITA and which support inner rail assemblies. For instance, as illustrated in FIGS. 1 and 3, examples of outer wall members in a two-tiered system include a bottom wall 24, a top wall 30 and a middle wall 26 there between. Therefore, the receiver 46 in these examples have two openings: a lower tier opening 22 and an upper tier opening 20. The spacing of the middle wall 26 between the bottom wall 24 and top wall 30 will vary based upon the dimensions of the various connector modules and interconnects, as discussed herein.

Figure 2:
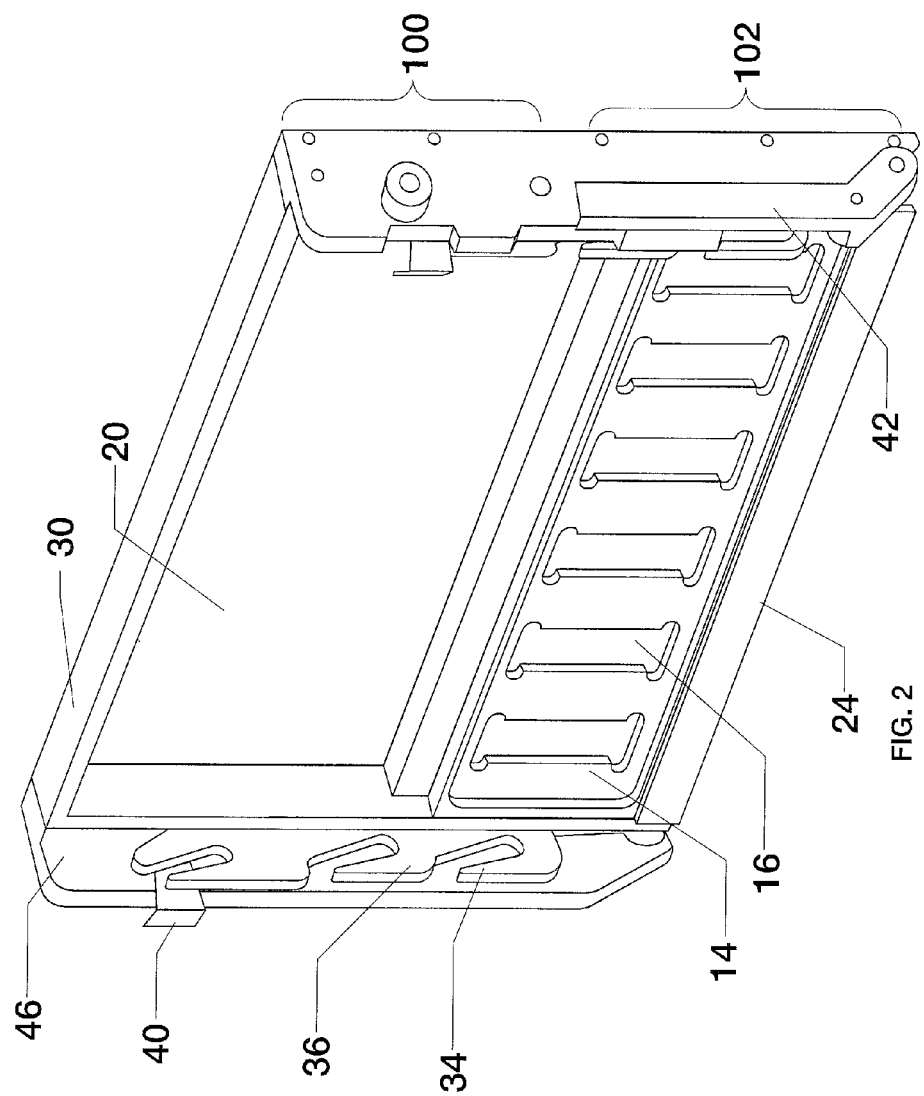
FIG. 2 is a front perspective view of the mass interconnect assembly embodiment of FIG. 1.

As shown in FIGS. 1 and 3, bottom wall 24 and middle wall 26 define lower tier opening 22, which is generally an elongated, rectangular-shaped orifice. Typically, lower tier opening 22 may be sized to receive a variety of receiver assembly 1 elements, for instance interconnect components and/or adjacent carrier building block assembly 14, as an integral unit to be utilized in a variety of configurations. Similarly, middle wall 26 and top wall 30 define upper tier opening 20. While two openings, 22 and 20, are depicted in FIGS. 1 and 2, other embodiments including other arrangements having other numbers of openings, for instance a unitary opening and/or additional rows of openings as discussed later.

FIGS. 1 and 3 further introduce the inner rails along the wall support members to engage the interconnect components and building block assemblies. In some examples, the inner rails may function as an orientation alignment for interchangeably positioning the interconnect components and building block assemblies in a variety of testing configurations and arrangements, while being aligned to mate with their corresponding connections as described herein. As shown in FIGS. 1 and 3, the rail assembly in a two-tier system may include a lower rail 56, an upper rail 58 and an intermediate rail 60 there between. The spacing of the intermediate rail 60 between the lower rail 56 and upper rail 58 will vary depending upon the various connector modules and interconnects discussed herein.

Receiver 46 may have a sliding hanger assembly including a hanger structure and a hanger slide retainer, so that receiver 46 will be flush with the facing surfaces of interchangeable test adapter 12. In some examples, mounted inwardly adjacent to the sliding hanger assembly are left and right slide plates 36. The pair of slide plates may be mounted in any conventional manner so as to slide upwardly and downwardly with respect to the coordinate system of the figures. The motion of the slide plates may be coincident and simultaneous, and for instance, driven by a user. In particular examples, a user may actuate a handle 42. As illustrated in FIGS. 1, 3 and 9, handle 42 may be mounted to one side of receiver 46 and pivot about an axis defined by one end of a torsion shaft, for instance a shaft that runs about the length of receiver 46, for instance as later illustrated in FIG. 8. In some examples, handle 42 may connect two drive linkages, for instance one on each of the left and right sides of receiver 46, as also shown later in FIG. 8.

As shown in FIGS. 1 and 3, each of slide plates 36 may include one or more cam slots 34. Other embodiments include a variety of cam slots 34, for instance to correspond to the number of roller pins 44 positioned on interchangeable test adapter 12 with which receiver 46 is designed to engage. Typically, cam slots 34 are sized to accommodate the interchangeable test adapter 12 roller pins, for instance during upward movement of the slide plates 36. In some examples, cam slots 34 engage roller pins 44 to cause the interchangeable test adapter 12 to move inwardly, for example into engagement with receiver 46. Typically, the electrical contacts carried by the interchangeable test adapter 12 are thereby brought into engagement with the corresponding electrical contacts carried on receiver 46. Similarly, downward movement of slide plates 35 may trigger interchangeable test adapter 12 to move outwardly to disengage electrical contacts carried by the interchangeable test adapter 12 with electrical contacts carried by receiver 46.

Figure 8:
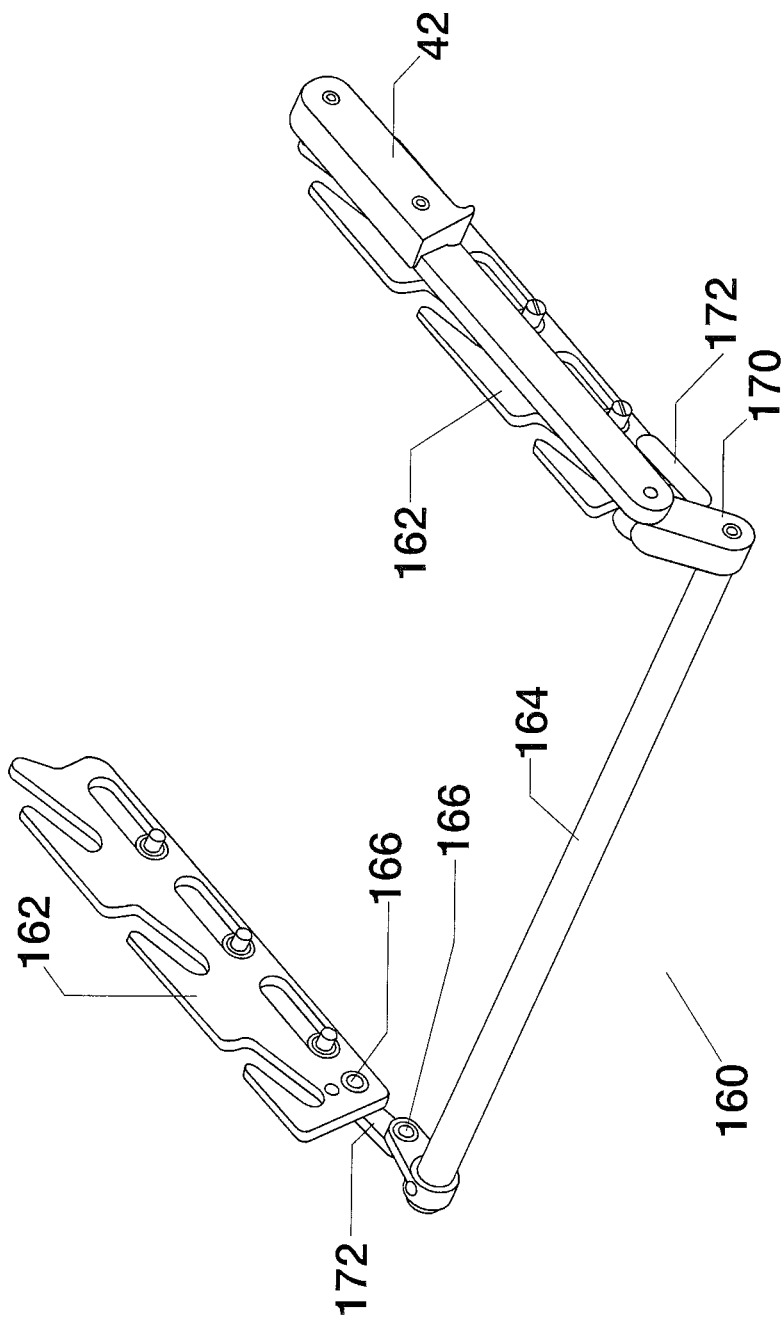
FIG. 8 is an isolated perspective side view of a linkage assembly in the receiver according to one embodiment of the disclosure, with elements omitted for clarity.
Figure 9:
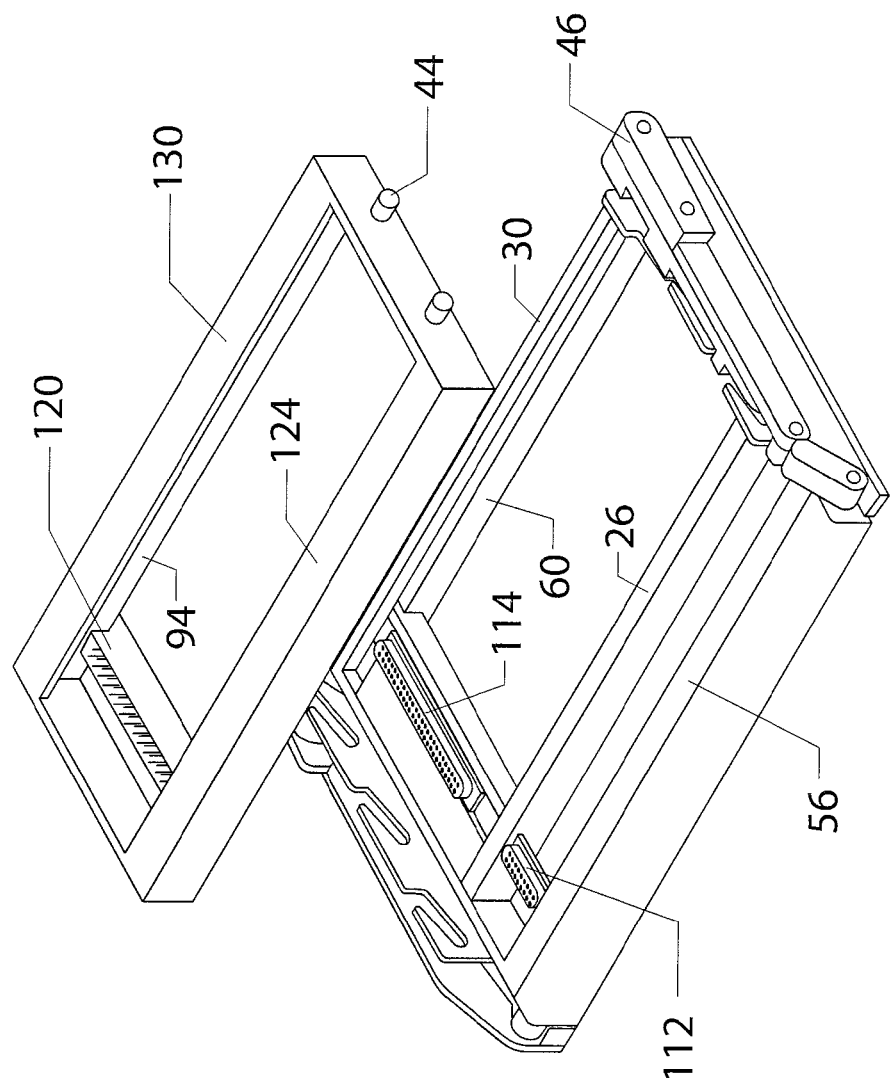
FIG. 9 is partially exploded front perspective view a further embodiment of a mass interconnect assembly, including a single tier test adapter.

Turning to FIG. 8, a modular linkage assembly 160 may enhance engagement of the receiver 46 with the ITA 12. The modular linkage assembly includes a torsion shaft 164 between opposing vertical sides 162 of receiver 46. As shown, a pair of opposing drive linkages 170, 172 on either the left, right or both sides of the receiver may connect the handle 42 and drive movement of the torsion shaft 164. Bearings 166, for instance needle bearings or the like, may be positioned at friction points along the modular linkage assembly to reduce, or even eliminate, galling or seizing. In these examples, the bearings 166 improve the life of the system, as well as provide significant improved feel for the operator when engaging, disengaging the receiver and ITA.

Returning to FIGS. 1 and 3, the lower tier opening 22 may house a variety of interconnect devices that mate with corresponding connections on the ITA. In one embodiment, as illustrated in FIGS. 1 and 2, a substantially permanent adjacent carrier building blocks 14 may mount different types of contacts, for example, contacts that carry electrical power or electrical signals, or contacts of different construction. Adjacent carrier building blocks 14 may define an integral system that is sized to accept and retain a plurality of connector modules to engage electrical contacts carried by the interchangeable test adapter 12 and receiver assembly 10, as described below.

As shown in FIG. 1, adjacent carrier building blocks 14 may include a lower rail 56 and an upper rail 58 that define a chassis side 50. Typically, the chassis side 50 may electrically engage connections in communications with testing equipment, for instance to a PXI. On the opposing side of the building block assembly is a mating side 52 to electrically engage the interchangeable test adapter 12. In some examples, this arrangement is in a substantially fixed position. For instance, adjacent carrier building blocks 14 may be securely positioned within lower tier opening 22 in a substantially fixed position to allow modularity of electrical contacts corresponding to a variety of electrical contacts of interchangeable test adapter 12. Further, carrier building blocks 14 may include adapter openings 54 that are sized in a substantially fixed position, so as to secure adjacent connect modules 16 in a variety of configurations.

Figure 4:
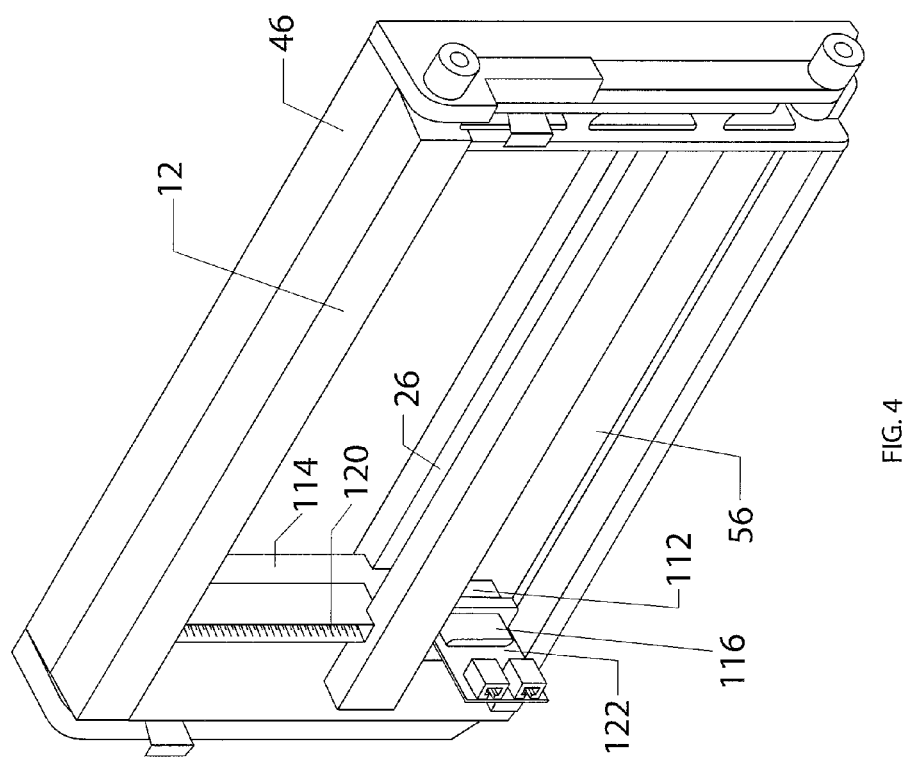
FIG. 4 is a side perspective view of the mass interconnect assembly embodiment of FIG. 3.

In yet other embodiments, as illustrated in FIGS. 3 and 4, the receiver 46 may include an interchangeable infrastructure to support a variety of connector module arrangements to mate with their corresponding connections as described herein. For instance, as shown in FIG. 3, the rail assembly allows convenient integration and interchange of interconnect modules 112 and 114, for example from the rear face of the assembly, to mate with ITA modules 116 and 120. Typically, the upper tier includes a rail system between the bottom wall and the middle wall, wherein interconnect modules 112 may be secured from the rear face of the receiver and mate with the corresponding ITA module. Similarly, in a two-tier system as shown, the upper tier may include a rail system within the boundary of the top wall and middle wall to secure interconnect modules 114 to mate with the corresponding ITA module. Again, the interconnect modules 114 may be integrated in the system from the rear face to minimize, or eliminate, the concerns associated with feeding the system through the testing assembly and/or to reducing tooling and integration expertise.

The adjacent connector modules 16 and interconnect modules 112 and 114 may house a variety of electrical contacts and typically include a wiring side 70 and a mating side 72. Connector modules 16 and interconnect modules 112 and 114 may be made from a variety of materials depending on the desired electrical characteristics. For instance, connector modules 16 may be comprised of NEMA Grade Epoxy Glass G-10 to provide enhanced electrical isolation values.

Further, as shown in FIGS. 1 and 3, adjacent connector modules 16 and interconnect modules 112 and 114 may include a wiring face 70 to carry either a digital or an analog signal. In some examples, the frequency range may be DC up to about forty gigahertz. Further, the current can be up to about fifty amps. In other embodiments, a thermocouple, vacuum and/or pneumatic may be included to complete the connection with connector modules 16. However, as shown in FIGS. 1 and 3, adjacent connector modules 16 and interconnect modules 112 and 114 are typically sized to include electrical contacts to mate with the ITA modules and/or engage the electrical contacts carried by a test fixture interconnect 80.

FIG. 2 shows a perspective view of one embodiment of a receiver assembly 10 introduced in FIG. 1, with upper tier 100 and lower tier 102 in an assembled position. As illustrated, lower tier 102 may include connector modules 16 providing high and low density I/O connectors embedded in adjacent carrier building blocks 14 within the lower tier opening. From a rear perspective of this embodiment, the connector modules 16 may support a variety of electrical connection configurations. For instance, a plurality of connector modules 16 may include split line connectors to indicate at least two connectors on wiring side 70. Other embodiments include a variety of connector and connector module 16 configurations as discussed below.

In one example of the assembled position, the mating side of connector modules 16 is positioned between adjacent carrier building blocks 14, for example in a specific configuration to match a particular piece of testing equipment. A filler plate 94 may be included to block and protect elements of receiver assembly 10, for instance unused connections in connector modules 16. In such a mass interconnect system embodiment a PXI instrument may be attached to a receiver connector module, for instance through a direct access kit (DAK) adapter. The DAK adapter may provide direct connectivity between the PXI instrument and the receiver connector module. Typically, the instruments may be installed and/or removed through the front face of the receiver connector module. Unlike this DAK assembly, traditional cable-based ATE systems and devices often require system calibrations that take significant time to remove and carry the risk of performance problems once reinstalled.

As shown in the partially assembled position in FIG. 2, one embodiment of receiver assembly 10 connects with a test fixture interconnect 80 on the wiring side 70 of connector modules 16. Test fixture interconnect 80 may include several thousand connections in a single engagement with connector module 16. In particular examples, test fixture interconnect 80 may include Flex connectors, PC boards and pre-configured patch cords.

FIG. 4 shows another embodiment of a receiver assembly 10 introduced in FIG. 3, with an upper tier and lower tier in an assembled position. As illustrated, the lower tier may include at least one interchangeable connection module 112 integrated on the receiver 46 and mated with a corresponding ITA connection adapter module 116. Again, the connection module may provide high density I/O connections. As shown, the receiver assembly provides contact pins to incorporate small connectors with both large interchange assemblies and other smaller mass interconnect systems, thus reducing spares, inventory, tooling demands, and other wire cramping, etc. concerns. In particular examples, the ITA connection adapter module 116 may include a printed circuit board assembly 122 or the like for improved user connections as discussed hereinafter. Further, as shown in FIG. 4, the upper tier may include at least one upper interchangeable connection module 114 to generally mate with a corresponding ITA connection adapter module 120. While FIGS. 3 and 4 illustrate only one connection module on the upper and lower tiers, the inventions herein provide convenient infrastructure for a variety of connection module arrangements to meet a variety of mass interconnect demands.

Figure 5:
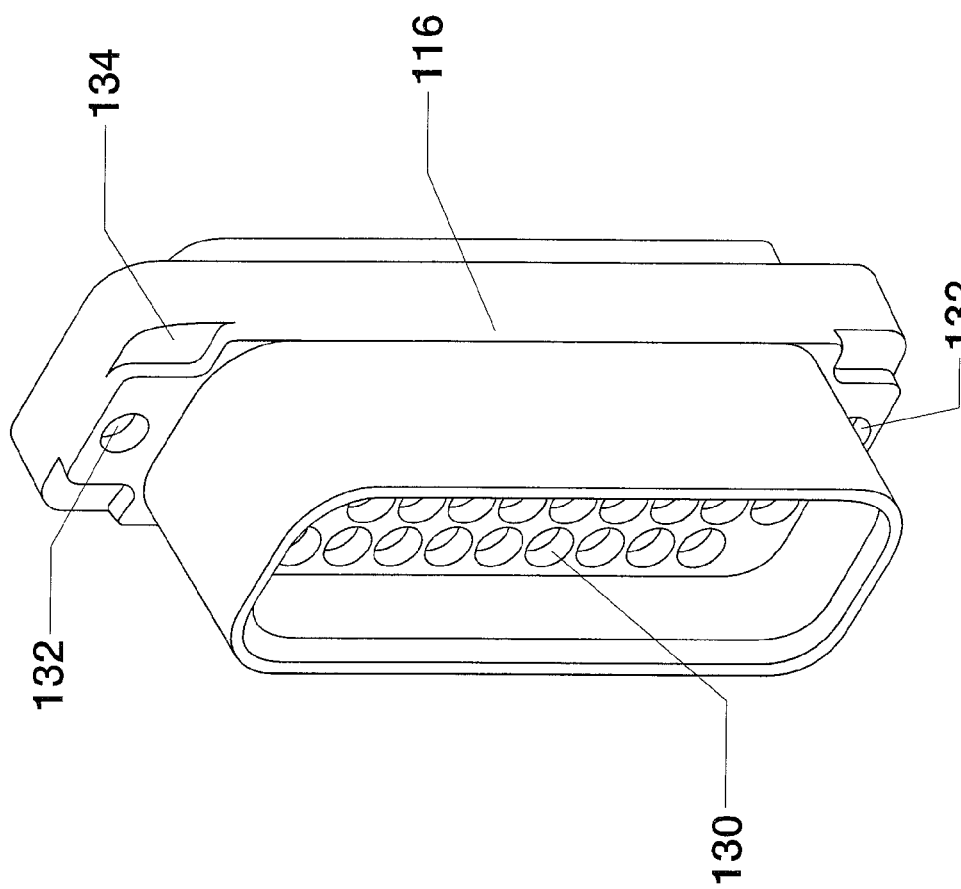
FIG. 5 is an isolated perspective front view of one embodiment of an interchangeable adapter connector introduced in FIG. 3, with elements omitted for clarity.

FIG. 5 shows an isolated view of one embodiment of an ITA connection module introduced in FIGS. 3 and 4. Typically, the ITA connection adapter module 116 includes a body to support an engagement lip to mate with an upper or lower interchangeable connection module 112,114, as well as housing for contact points 130. As shown, the upper and/or lower ends of the body may include apertures to receive fasteners to secure the ITA connection module with the opposing connection element. Further, as illustrated, location tabs 134 on the back side of the body allow the user to easily plug the element into place with fasteners through apertures 132, or similar securing procedure recognized by those skilled in the art.

Figure 6:
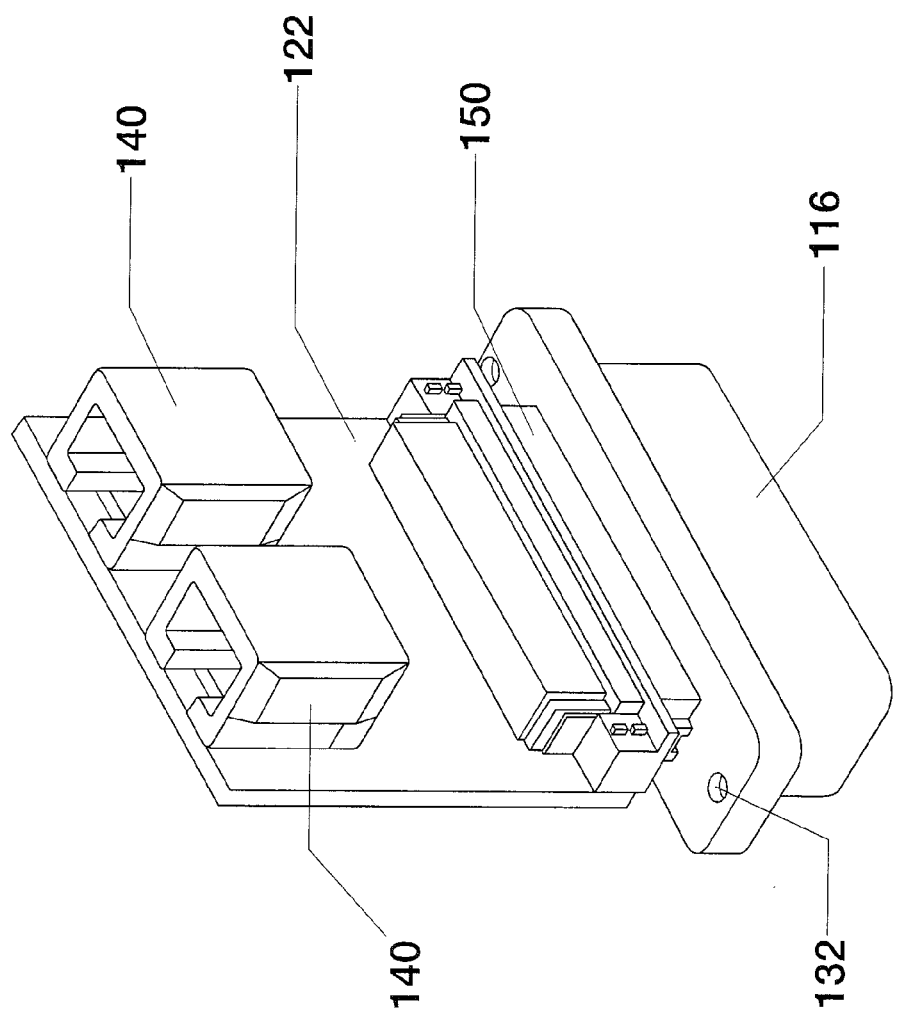
FIG. 6 is an isolated perspective side view of one embodiment of an adapter connector with a printed circuit board as introduced in FIG. 3, with elements omitted for clarity.

FIG. 6 shows an isolated view of one example of the ITA connection adapter module with a printed circuit board assembly 122 introduced in FIGS. 3 and 4. Typically, a signal element body 150 may be secured to the connection adapter module 116 and generally support the printed circuitry board assembly. As shown, particular examples of the printed circuit board assembly 122 may include HDMI, or similar connections 140. For instance, the printed circuit board may allow connection of HDMI, Ethernet, DMI, USB, seta signal transmission technology and the like, to interplay with the mass interconnect assembly. Such an arrangement significantly improves the interaction of the devices and minimizes the time for integration without the demands and concerns of traditional wiring systems. For instance, standard off-the-shelf cable products may be quickly and easily utilized in the connection 140, thereby minimizing the integration demands and/or skill level required for testing set-up.

Figure 7:
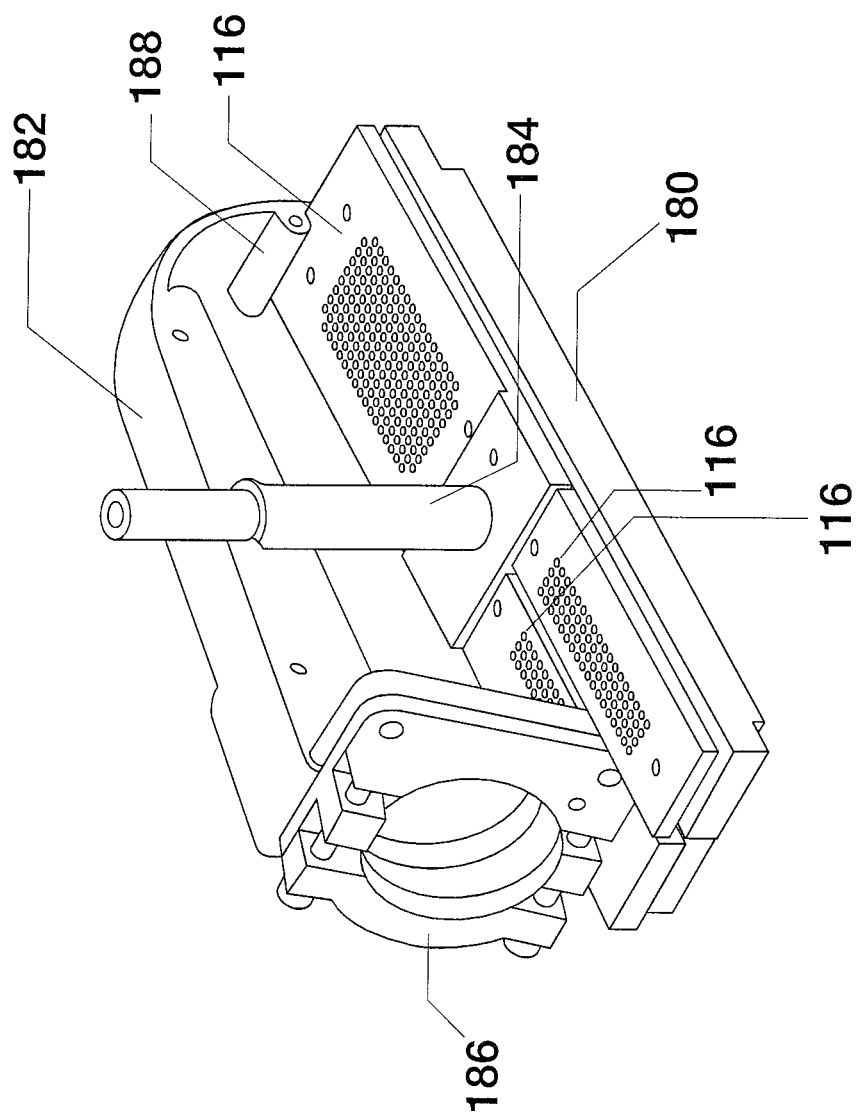
FIG. 7 is an isolated perspective side view of an adapter module according to yet another embodiment of the disclosure, with elements omitted for clarity.

FIG. 7 shows another embodiment of connection adapter module 116 having a low insertion force connection 180 that may be used in any of the flexible receiver assembly inventions described herein. For instance, a LIF connector may provide pin and socket connections, for instance for a more rugged connection alternative. Further, LIF embodiments may be advantageous where service requires frequent connects/disconnects. Some examples of LIF include 96, 156 and 260 contact configuration. Typically, LIF connectors are mounted by rotating the mechanism, for example about one hundred and eighty degrees, to engage the LIF mating half. The connector may include a LIF plug 184 affixed to the ITA connector adapter modules 116. A shell 182 may enclose the connections with only the LIF plug protruding through the shell 182. FIG. 7 illustrates a partial shell to show internal components. Further, the shell 182 may be hinged 188, or the like, and include fasteners, for instance attachment 186 as shown in FIG. 7 and the like as recognized by those skilled in the art.

Other embodiments of LIF include a polarizing LIF to provide a unique identity to each connector. A variety of embodiments of LIF plug connectors may be incorporated into the mass interconnect assembly. For instance, a 156 position LIF plug may be used for discrete wiring. Further, hybrid LIF plug with 15 signal positions for instance 16 coax/power, may be incorporated into the system. Still further, a hybrid LIF plug with 72 signal positions for instance 18 coax/power may be incorporated into the system.

A variety of LIF sockets may be used in any of the inventions herein. For instance, a PCB socket may provide enhanced interconnection for rugged system for discrete wiring. Additionally, hybrid sockets that provide a 96 position LIF socket for discrete wiring; hybrid LIF socket for 16 signal positions, for instance having 16 coax/power; and/or hybrid LIF socket with 72 signal positions, for instance having 18 coax/power may be incorporated by any of the inventions shown and described herein.

In yet other examples, receiver coax elements may be incorporated into the inventions described herein. For instance, a 152 position coax module; a 59 position coax module; a 9 position hi-frequency coax module, for instance a 9 position module for SMA; a 12 position hi-frequency, 40 gigahertz module; an 18 position hi-frequency coax module rated for about 50/75 ohms; a 24 position mini-coax module; a 6 position triax module; and/or a 32 position coax module rated for about 50/75 ohms may be incorporated by any of the inventions shown and described herein.

Still further examples may include a variety of receiver power elements. For instance, a 152 position power module; a 24 position power module; and/or a 59 position power module may be incorporated by any of the inventions shown and described herein.

Additional examples include a variety of receiver signal elements. For instance, a mounting side and a wiring side of a 160 position DIN signal module; a 96 position HDI/DIN signal module; a 200 position HDI signal module; and/or a 96 position discrete signal module may be incorporated by any of the inventions described herein.

As introduced above, hybrid elements of certain embodiments of connector modules may be incorporated by any of the inventions described herein. For instance, a hybrid pneumatic plus 24 signal module may be incorporated by any of the inventions shown and described herein.

FIG. 9 shows anther embodiment of the mass interconnect assembly introduced above, wherein the ITA includes only a single tier to mate with any of the receiver embodiments shown or described herein. In this embodiment, an ITA connection module 120 may span the entire distance between the upper wall 120 and lower wall 124 and mate with the corresponding receiver connection module. This ITA embodiment may include any of the features and elements shown and described above.

Returning to FIGS. 1 and 3, interchangeable test adapter 12 generally engages with the corresponding contacts of the connector modules 16 carried by receiver assembly 10. In particular embodiments, interchangeable test adapter 12 includes predetermined numbers of replaceable modules having various arrays of electrical contacts thereon requiring engagement with the co-acting contacts carried by receiver assembly 10. As shown, interchangeable test adapter 12 may include left and right sides and a set of locking members, for instance roller pins 44.

In some examples, roller pins 44 have a set of adjacent, independently moveable roller sleeves. The receiver assembly 10 may be fully engaged with interchangeable test adapter 12 such that electrical contacts carried by interchangeable test adapter 12 are fully engaged with electrical contacts carried by receiver 46. In some examples, interchangeable test adapter 12 abuts receiver 46 to form a moisture-resistant seal. In other embodiments, an enclosure encases the interchangeable test adapter 12. The enclosure may include electromagnetic shielding. Further, the enclosure may include a hinged door or a removable face.

In other embodiments, the disclosure includes a mass interconnect kit. In such an embodiment, the kit may comprise a receiver, e.g. any of the receiver elements and components previously shown or described. Further, other embodiments of the kit may comprise an ITA, e.g. any of the ITA elements and components previously shown or described. In this respect, a receiver assembly 10 may be built on a bench, so that any of the elements or components described herein may be 'built-up' prior to installing the system as discussed above.

Building the assembly on a bench may allow for 360 degree access, for instance to load connectors from the back side. Therefore the harness may be built-up for a desired testing sequence, without having to feed the assembly through the interface into the system. This improves integration time, minimizes tooling and related expertise requirements, and reduces potential damages associated with feeding the assembly into the system after it is built. The result is a mass interconnect tool kit that operates in different mechanics, and is interchangeable with existing contacts by incorporating small connectors to utilize in larger connection packages.

In further use of some embodiments of the disclosure, the receiver assembly 10 of the flexible mass interconnect system may provide a PCB or short wire interconnection to the test system, for instance a PXI-based test system. For instance, the PXI instrument may be attached to receiver assembly 10, i.e. connector module 16 housed in adjacent carrier building blocks 14 of receiver 46, to provide direct connectivity between the PXI instrument, or similar testing equipment, and the receiver assembly 10. The receiver assembly 10 of the flexible mass interconnect system may be easily installed and removed without disturbing the system wiring.

Figure 10A:
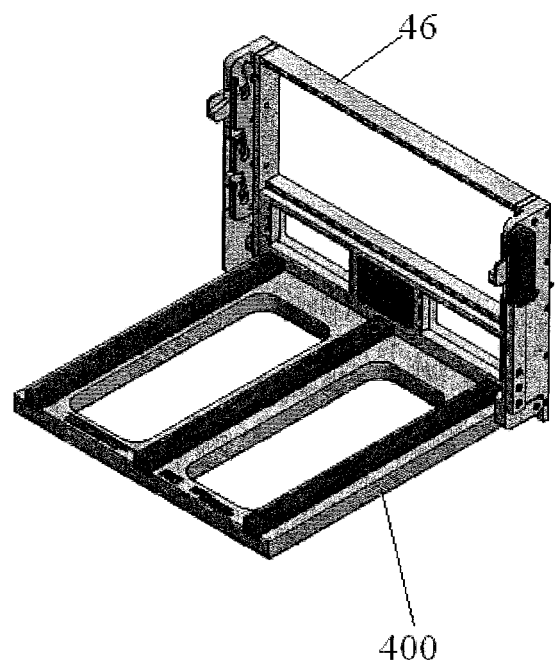
FIGS. 10a and 10b are perspective views of a receiver assembly embodiment with a work shelf.
Figure 10B:
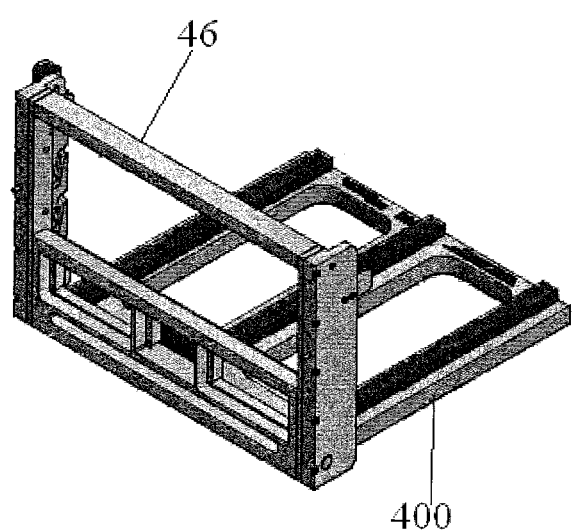

FIGS. 10a and 10b illustrate one example of a receiver assembly 46, e.g. any of the receiver elements and components previously shown or described, with a work shelf 400. Typically, the work shelf 400 is releasably connected to the receiver assembly 46 and includes a work surface to support connection elements previously shown or described.

Numerous characteristics and advantages have been set forth in the foregoing description, together with details of structure and function. Many of the novel features are pointed out in the appended claims. The disclosure, however, is illustrative only, and changes may be made in detail, especially in matters of shape, size and arrangement of parts, within the principle of the disclosure, to the full extent indicated by the broad general meaning of the terms in which the general claims are expressed. It is further noted that, as used in this application, the singular forms "a," "an," and "the" include plural referents unless expressly and unequivocally limited to one referent.

We claim:

1. A mass interconnect system comprising:
   a. a test adapter; and
   b. a flexible receiver assembly having interchangeable connection modules affixed from a rear face of said receiver assembly and a modular linkage assembly having needle bearings at friction points to engage said test adapter, wherein said flexible receiver assembly and interchangeable connection modules form an integral structural unit adapted to mirror and mate with said test adapter.

2. The apparatus of claim 1, wherein said test adapter includes at least one adapter module to mirror connection with said receiver interchangeable connection module.

3. The apparatus of claim 2, wherein said adapter module including a mating face configured to interface with said receiver interchangeable connection module in an assembled position.

4. The apparatus of claim 2, wherein said adapter module including a printed circuit board.

5. The apparatus of claim 4, wherein said printed circuit board including a cable attachment for communication devices chosen from HDMI, Ethernet, DMI, USB, seta signal transmission technology and a combination thereof.

6. The apparatus of claim 5, wherein said adapter module including at least one location tab for orienting the adapter module into placement about the test adapter.

7. The apparatus of claim 1, wherein said interchangeable test adapter includes a test adapter frame having a first, second, third and fourth sides, said first and second sides opposing one another and said third and fourth sides opposing one another and said first and second sides being substantially perpendicular to said third and fourth sides.

8. The apparatus of claim 7, wherein said test adapter frame separates said test adapter into an upper tier and a lower tier.

9. The apparatus of claim 7, wherein said test adapter frame includes roller pins being positioned to align with said receiver assembly in a mated position.

10. The apparatus of claim 1, wherein said test adapter is a legacy adapter.

11. In a mass interconnect system having a test adapter and a testing unit, a flexible receiver assembly comprising:
    a. an integral structural unit to mirror connections and slidingly mount with said test adapter to communicate with said testing unit;
    b. at least one rear-loading building block assembly; and
    c. a modular linkage assembly having needle bearings at friction points to engage said test adapter.

12. The apparatus of claim 11, wherein said flexible receiver assembly including a frame having an upper tier opening adapted to accept adjacent interchangeable connection modules.

13. The apparatus of claim 11, wherein said flexible receiver assembly including a frame having a lower tier opening adapted to accept adjacent interchangeable connection modules.

14. The apparatus of claim 13, wherein said lower tier including a rail assembly to secure said interchangeable connection modules.

15. The apparatus of claim 14, wherein said interchangeable connector modules are assembled in adjacent carrier building blocks.

16. The apparatus of claim 11, wherein said modular linkage assembly having a torsional shaft between a pair of opposing vertical sides of said receiver.

* * * * *

UNITED STATES PATENT AND TRADEMARK OFFICE
CERTIFICATE OF CORRECTION

PATENT NO. : 8,740,654 B2
APPLICATION NO. : 13/586249
DATED : June 3, 2014
INVENTOR(S) : Sedberry, Jr. et al.

Page 1 of 1

It is certified that error appears in the above-identified patent and that said Letters Patent is hereby corrected as shown below:

In the Specification

In Column 5, Line 20, sprit should be "spirit"

In Column 10, Line 20, anther should be "another"

Signed and Sealed this
Second Day of September, 2014

Michelle K. Lee
*Deputy Director of the United States Patent and Trademark Office*